United States Patent [19]
Kinzelman

[11] Patent Number: 6,144,930
[45] Date of Patent: Nov. 7, 2000

[54] METHOD FOR PROVIDING A MEMORY MODEL OF A MEMORY DEVICE FOR USE IN SIMULATION

[75] Inventor: Paul Matthew Kinzelman, Sunnyvale, Calif.

[73] Assignee: Compaq Computer Corporation, Houston, Tex.

[21] Appl. No.: 08/073,911

[22] Filed: Jun. 9, 1993

[51] Int. Cl.[7] .................................................. G06F 17/50
[52] U.S. Cl. ............................................. 703/13; 703/14
[58] Field of Search ........................... 395/500; 364/578, 364/254.3; 703/13, 14, 15–23

[56] References Cited

U.S. PATENT DOCUMENTS

| | | | |
|---|---|---|---|
| 4,862,347 | 8/1989 | Rudy ........................................ | 395/500 |
| 4,924,429 | 5/1990 | Kurashita et al. ...................... | 364/578 |
| 4,926,322 | 5/1990 | Stimac et al. ............................ | 395/500 |
| 4,937,770 | 6/1990 | Samuels et al. ......................... | 395/500 |
| 5,105,374 | 4/1992 | Yoshida ................................... | 395/500 |
| 5,193,068 | 3/1993 | Britman .................................. | 364/578 |
| 5,265,233 | 11/1993 | Frailong et al. ........................ | 395/425 |

*Primary Examiner*—Zarni Maung
*Attorney, Agent, or Firm*—Williams, Morgan & Amerson, P.C.

[57] ABSTRACT

A method for providing a memory model for simulation which includes the steps of allocating from memory a block of contiguous memory cells, storing a model of memory corresponding to a memory device in the memory, associating the stored model of memory to a corresponding one of the memory cells of the block of contiguous memory cells and, storing a location of the associated one of the memory cells within the model of memory.

1 Claim, 6 Drawing Sheets

METHOD FOR PROVIDING A MEMORY MODEL OF A MEMORY DEVICE FOR USE IN SIMULATION

BACKGROUND OF THE INVENTION

This invention relates generally to simulation of computer system hardware and more particularly to the modelling and simulation of memory systems.

As is known in the art, a computer system is generally comprised of a central processing unit (CPU), a memory unit, at least one input/output device, and a bus which is used to connect the aforementioned devices. The central processing unit is used to fetch and decode incoming instructions, execute commands, and manipulate data, whereas the memory unit, which includes multiple storage locations, stores data to be used by the CPU. The I/O device is generally used to input data to and output data from the computer system. Typical types of I/O devices include printers, keyboards, displays and mass storage units such as disk drives etc. These devices are often interfaced to the computer system with an I/O interface controller circuit.

Designing a computer system involves numerous, complex steps. Engineers generally design computer systems by starting with a high level functional description of the desired system. Once the functional description of the design is determined, it is used to provide a detailed logic design for the system. The detailed logic design process is an elaborate process which involves determining actual logic circuits to provide the functional description and electrical characteristics of those circuits. Moreover, the process generally requires determination of the interactions of interconnected circuits until the electrical design is complete and corresponds to the initial functional description.

As the complexity of computer systems has increased it has become necessary to verify the functionality of a computer system design before the system is built. A universally accepted technique of doing this is through simulation.

Simulation of a computer system involves producing software models which simulate the actual hardware logic design. Test programs are run on these software models to test the design and uncover design errors. In this way, the designer can observe how the hardware will operate under various test conditions.

Typically, when modelling a computer system including memory devices, each memory device in the system is individually modeled. Each memory device model includes the characteristics of the memory device necessary to duplicate its functionality, as well as storage in which to save any data written to it. Under this scheme, each available memory location of the design system has a counterpart in the simulation. This approach requires the use of large amounts of the simulation system's memory to reproduce the design system's memory system.

A problem associated with simulation is that computer system hardware is often very complex, and thus, the software models of the hardware and the test programs to exercise the software models are likewise complex. As such, execution of the software models and test programs can dominate use of a simulation computer system's resources and moreover, take a very long time to complete execution. Usually, test programs are very CPU intensive, that is the test programs use large blocks of time in the CPU. Accordingly, such programs can disable other processes from gaining processing time in the CPU. In addition, these software models and test programs can take days or weeks to complete before the program data becomes available to the engineer modelling the system.

In addition to the demands on central processor time, a further problem with simulations is that the software models of the computer hardware can occupy large blocks of memory in the computer system executing the simulation, because all the information necessary to fully model all characteristics of the hardware must be stored. While the program executes, additional portions of memory are required to store the actual data obtained from the simulation as mentioned above. The simulation computer system, in addition to storing the actual data resulting from the simulation generally also stores the predicted data expected from the simulation. Generally, these two data collections are compared to determine whether any errors occurred during the execution of the test program.

Typically, in the computer system executing the simulation, the predicted data is stored in a block of memory, which may be ordered into an array structure. The actual data from the simulation is found in the individual memory models. Each individual memory model typically occupies a segment of memory and includes inter alia locations to store results of the transactions. In order to verify the data, the predicted array is compared to the data stored in the individual memory models. For each location of the predicted array, the location of the corresponding memory model is determined and the data stored in the model is accessed. This data is collected and ordered into an array similar in structure to the predicted array resulting from the transactions. Once the new array has been provided, the contents of the two arrays are then compared to determine whether any errors occurred during the simulation. This requires the additional time necessary to produce the array of actual data. As such, twice as many accesses to memory are required, one to produce the array and one to compare the data, thus slowing down the verification process.

SUMMARY OF THE INVENTION

In accordance with the present invention, a method for providing a memory model for simulation includes the steps of allocating from a memory a block of contiguous memory; storing a software model of the memory device in the memory; assigning a portion of the allocated block of contiguous memory to the software model of a memory device; and storing the location of the assigned portion of the allocated block of contiguous memory within the software model. With such an arrangement, the data associated with the memory model is not contained within the model itself. Furthermore, storing the actual data in a memory structure which is identical to the array used for the predicted data simplifies the verification process. The arrays may then be compared in a sequential process using an identical procedure to step through each location of the array. In this way, the time necessary to locate the corresponding memory model and access its contents is saved as is the time needed to produce the actual data array. In addition, a smaller portion of memory is used because the data contained within the array need not be duplicated to perform verification.

In accordance with a further aspect of the present invention, a method for simulating memory in a computer system includes the steps of providing from a memory a first block of contiguous memory cells; storing in the memory a software model of the memory device; associating a portion of the allocated block of contiguous memory to the software model of a memory device; and storing the location of the associated portion of the allocated block of contiguous memory within the software model. The method for simulating memory in a computer system further includes randomly generating a computer transaction; predicting the effect the transaction will have on the first block of contiguous memory; executing and storing the result of the transaction within the first block of contiguous memory; and comparing the predicted effect with the stored result of the execution of the transaction. With such an arrangement, the data associated with the memory model is not contained within the model itself but is contained in a memory structure identical to the array used for the predicted data which simplifies the verification process. The arrays may then be compared in a sequential process using an identical procedure to step through each location of the array. In this way, the time necessary to locate the corresponding memory model and access its contents is saved as is the time needed to produce the actual data array. In addition, a smaller portion of memory is used because the data contained within the array need not be duplicated to perform verification. Further, with such an arrangement, randomly generated computer transactions test many conditions the designers of the system may not think of. Simulations are often limited to the problematic situations that the designers or testers think may arise during the operation of the designed system. By randomly generating transactions the thoroughness of the simulation is not dependent upon the imagination of the designer or test engineer.

In accordance with a further aspect of the present invention, a method for simulating memory in a computer system includes the steps of providing from a memory a first block of contiguous memory cells; storing within the memory a software model of a memory device; associating a portion of the allocated block of contiguous memory to the software model of a memory device; and storing the location of the associated portion of the allocated block of contiguous memory within the software model. The method for simulating memory in a computer system further includes randomly generating a computer transaction; translating a physical bus address of the memory device in the computer system to a mapped bus address of the model of memory; predicting the effect the transaction will have on the first block of contiguous memory; executing and storing the result of the transaction within the first block of contiguous memory; and comparing the predicted effect and the stored result of the execution of the transaction. With such an arrangement, a smaller amount of memory is available to the system being simulated. As a result more collisions occur when two processes attempt to access the same area of memory. This not only tests the collision handling functions of the system but also forces discovery of obscure design bugs which may be found through the unique interactions which result from the use of a smaller memory.

In the preferred embodiment the physical bus address includes four fields, a Column Address Strobe field, a Row Address Strobe field, a Bank Select field, and a Board Select field. The step of translating a physical bus address of said memory device further includes the step of selecting at least one bit, but not all bits, from each of the Column Address Strobe field, and the Row Address Strobe field and all of the bits from the Bank Select field and the Board Select field of the physical bus address to provide the mapped bus address.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
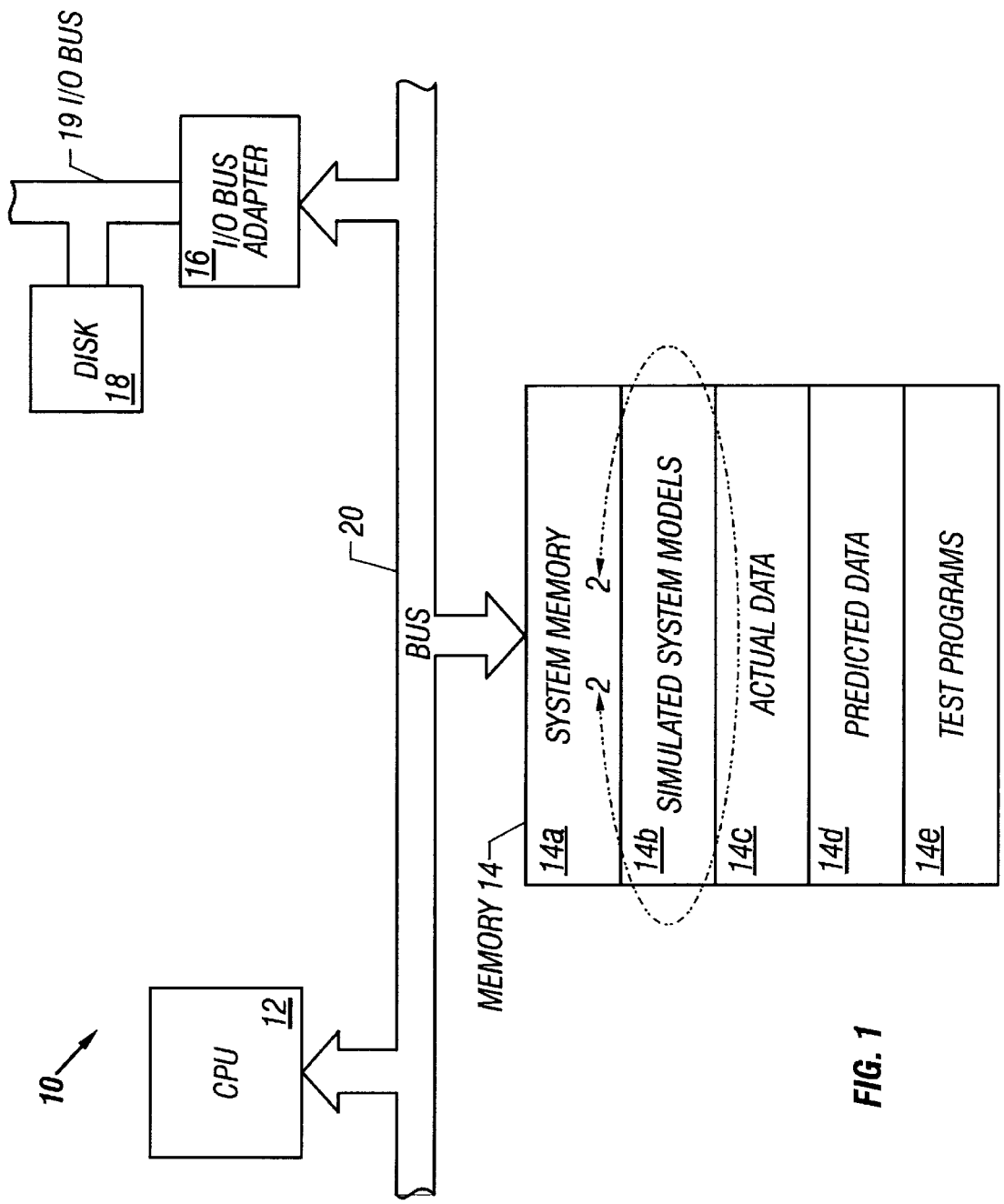
FIG. 1 is a block diagram of a system running the simulation.

Referring to FIG. 1, a simulation system 10 is shown to include a CPU 12, a memory 14, an I/O bus adapter 16, and I/O bus 19, a disk 18, an d a bus 20 interconnecting the CPU 12, memory 14 and I/O bus adapter 16. In general, FIG. 1 is a simplified representation of any suitable computer system on which a design simulation is to be conducted. The memory 14 is further logically partitioned into sections. A first memory section 14a of the memory is used to provide system memory which is used to store data and software associated with running of the CPU 12. A second memory section 14b is used to store the software models representing the system being simulated. Typically, such software models will include a model for each CPU in the computer system being simulated and a model for each memory device in the simulated computer system as well as system bus models and interface models. A third section 14c is used to store the actual data obtained during the execution of the test program during a simulation whereas a fourth section 14d is used to store the predicted data expected from the simulation.

A test program which may be stored in memory section 14e of the memory 14, is run in the simulation system 10 within the CPU 12 which uses the available memory 14. The CPU 12 executes the test program using the memory 14 available in the system. The CPU places the instructions from the test program on the bus which accesses the appropriate sections of memory. The test program as well as the software models may be stored on a disk 18 which is accessed through the I/O bus adapter which is an interface between the I/O bus 19 and the system bus 20. As necessary, data is retrieved from the disk 18 and copied into memory 14 while the program executes.

Figure 2:
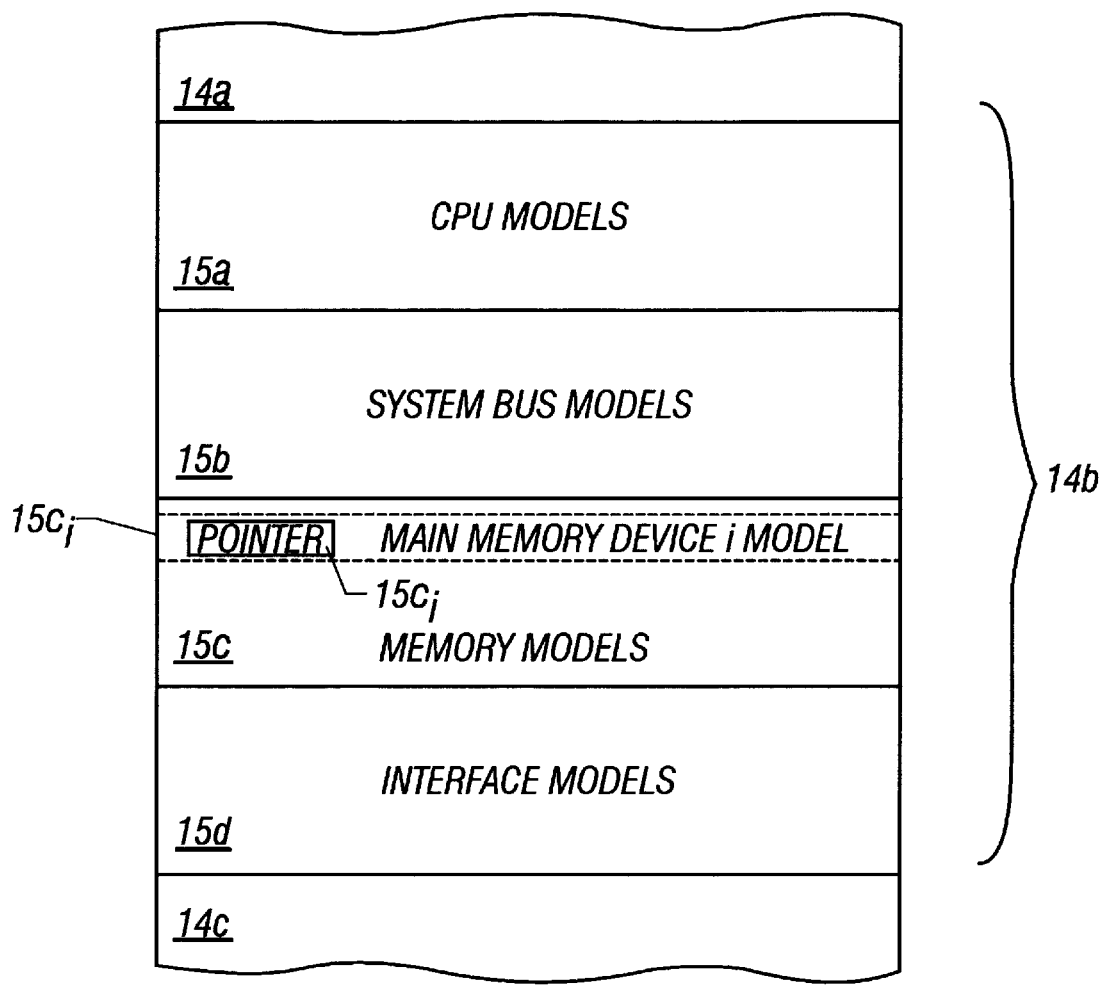
FIG. 2 is a blown-up view taken along line 2—2 of FIG. 1 showing details of a partition of a portion of a memory in the system of FIG. 1.

Referring now to FIG. 2 partitions of memory section 14b in FIG. 1 are shown to include partition 15a which contains the CPU models of the system being simulated and a memory partition 15b containing system bus models. The memory models of the system being simulated are contained in memory partition 15c which further includes a model of a main memory device $15c_i$ which has a location $15c_i'$ used as a pointer to a location within memory section 14c which will contain the data of memory model $15c_i$. Memory section 14b further includes partition 15d which contains interface models of the system being simulated.

Figure 3:
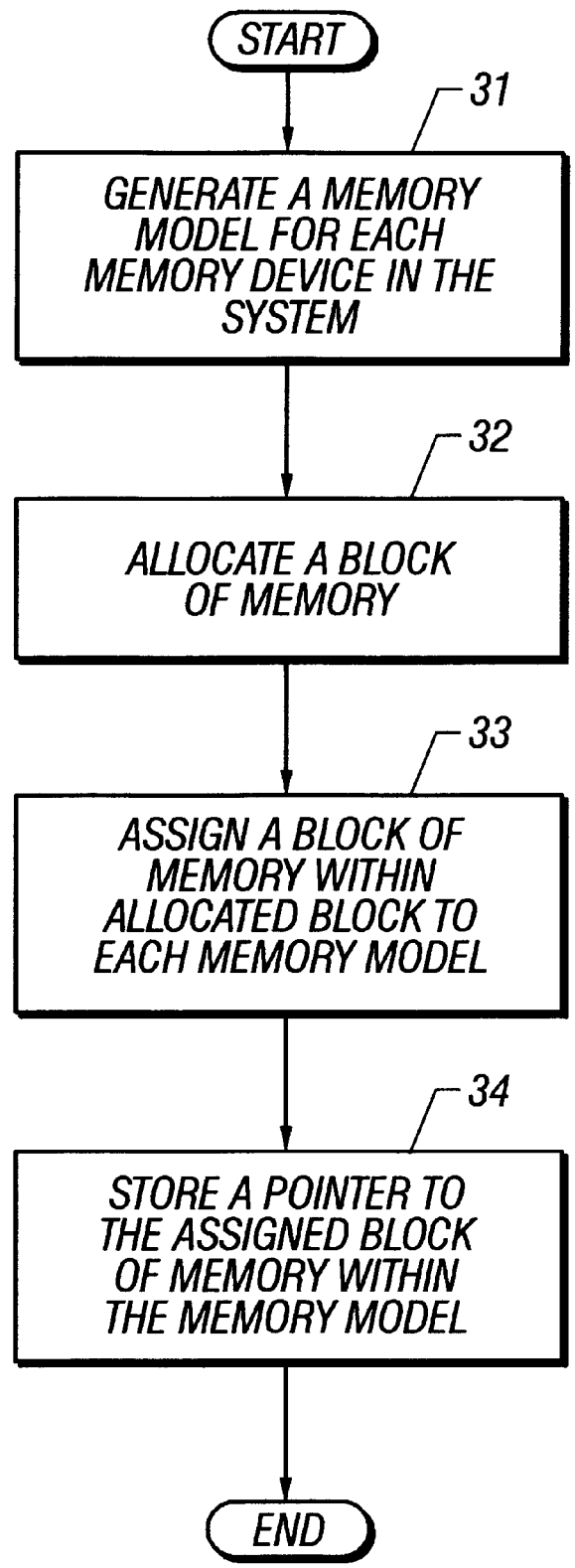
FIG. 3 is a flow chart depicting steps in modelling memory on the simulated computer system of FIG. 1.

Referring now to FIG. 3 the process of simulating a memory, includes the step of generating a memory model $15c_i$ for each memory device contained within the computer system to be simulated (step 31). This is done by providing a single memory model $15c_i$ and copying the model "n" times for each memory device in the system. Often this copying is referred to in the art as "instantiating" the memory model. Once the memory models have been generated, a separate block of memory of sufficient size is allocated (step 32) in memory section 14c to hold the full amount of memory required for the entire system. This memory section 14c serves as storage for the memory models. At step 33, each memory model 15$c_i$ is assigned a block of memory section 14c in which the particular memory model will store its data. By assigning memory storage outside the memory model, verification becomes a comparison of identical memory structures rather than a navigation between an array of memory and an individual memory location within each memory model, thus making the verification process more efficient. At step 34, a pointer 15$c_i'$ to the location of the memory assigned to the memory model is stored within the memory model itself.

Figure 4:
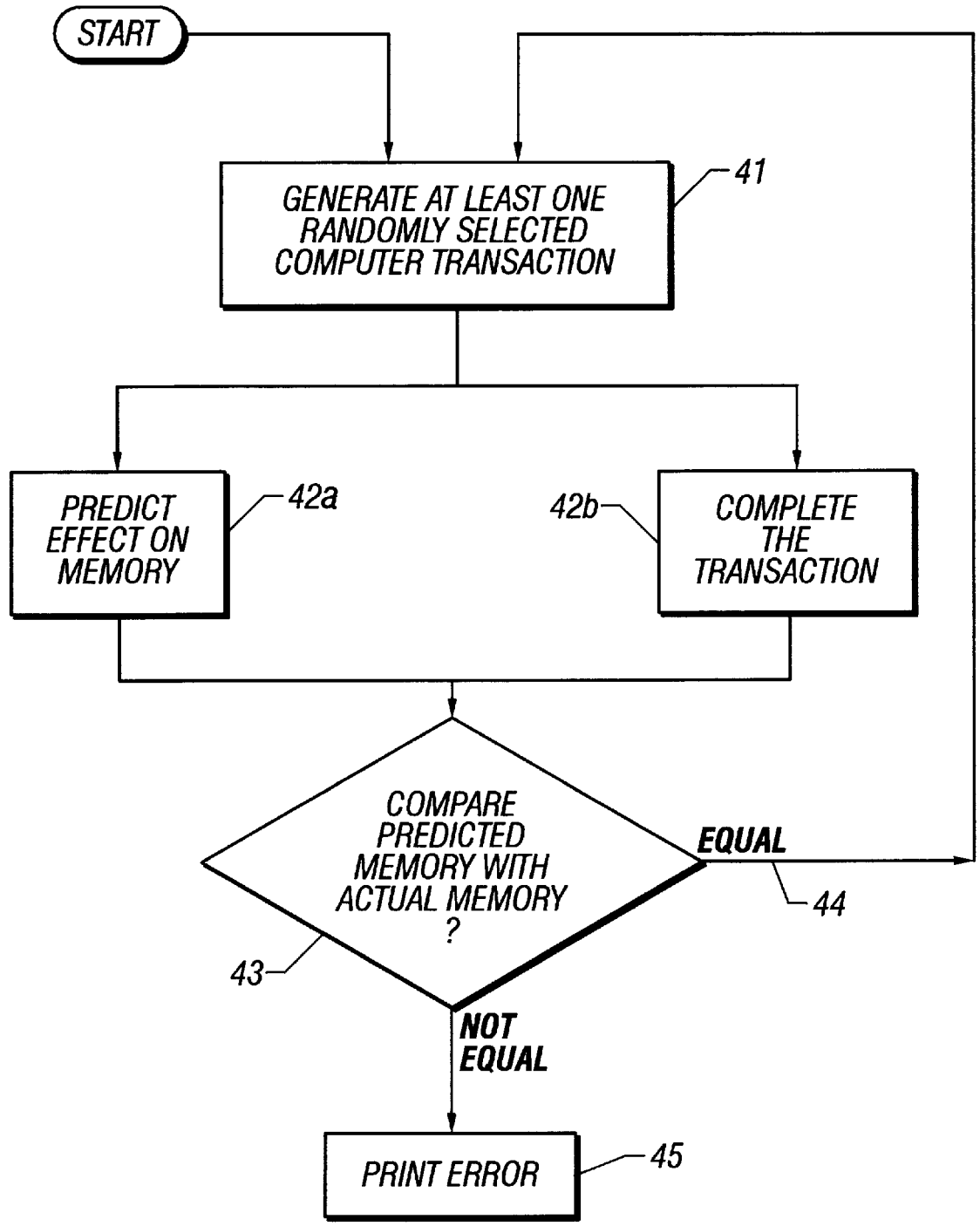
FIG. 4 is a flow chart depicting steps in simulating a computer design using the modeled memory of FIG. 2.

Referring now to FIG. 4, steps in the execution of a simulation are shown to include the step of generating a randomly selected computer transaction (step 41). The randomly selected computer transaction is either a read from memory or a write to memory.

In general at step 41 at least one, or preferably a large plurality of randomly selected computer transactions are initiated. That is, the test program initiates a read or write operation from the model of the CPU to the model of the memory. The predicted effect of the transaction on the memory model is determined by the test program at step 42a and the predicted data is stored in the memory 14 at a location in memory section 14d.

Correspondingly, the transaction is actually completed by execution of the memory models 15c. The results of the completed transaction are stored in the associated blocks of memory of memory section 14c at step 42b. That is, the results, if any, from the transaction are provided to the test program and the test program stores the results in a location of memory section 14c corresponding to an address contained in the respective pointer 15$c_i'$ in the particular memory model 15$c_i$. Preferably, a large plurality of transactions are generated. The predicted as well as actual data resulting from such transactions are stored in the memory sections 14c and 14d.

A comparison is made between the contents of memory section 14c, containing the actual data, and the contents of memory section 14d, containing the predicted data, at step 43, which occurs when the transaction is completed. If these contents are found to be equal at step 44, the process is repeated. If however, the values are unequal, an error message is printed at step 45 to a log file (not shown) to be used during debug of the system design and the test program stops executing. The message contains information regarding the miscompare which includes the address at which the miscompare occurred, the predicted (good) data which should be contained at the address as well as the actual (bad) data that was found at the address.

Figure 5:
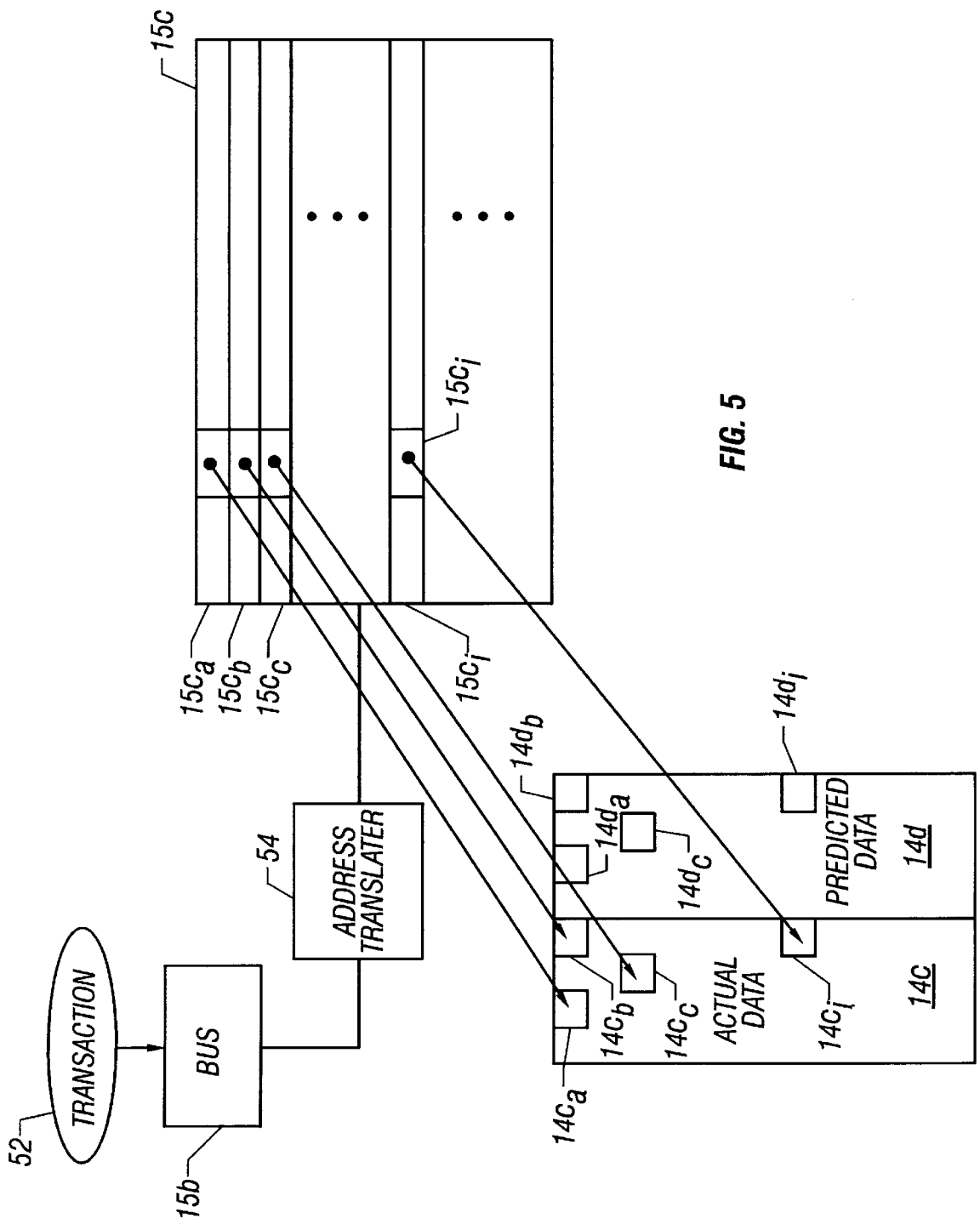
FIG. 5 is a pictorial representation of a completion of a command transaction using the modelled memory of FIG. 2.

Referring now to FIG. 5, execution of a transaction in accordance with the steps of FIG. 3 is shown. The test program causes a model 15a of a CPU to place a transaction 52 on a model 15b of a bus. The CPU model 15a executes the transaction using an address which assumes the complete system memory of the computer system being simulated is present. Because only a portion of the complete system memory of the computer system being simulated is available, an address translator 54 maps the physical address to a smaller mapped address to access a particular memory model 15$c_i$ in memory section 14b.

Here, mapping is a technique by which a particular memory model 15$c_i$ is accessed within memory section 14b by translating the physical address that would be used if the complete system memory were present into a mapped address.

The address translator 54 provides an addressing scheme used to access a group of the memory models 15c which selects at least one bit from each of these fields in the physical address to make up the mapped addresses which will be used to access an individual memory model 15$c_i$.

Figure 6:
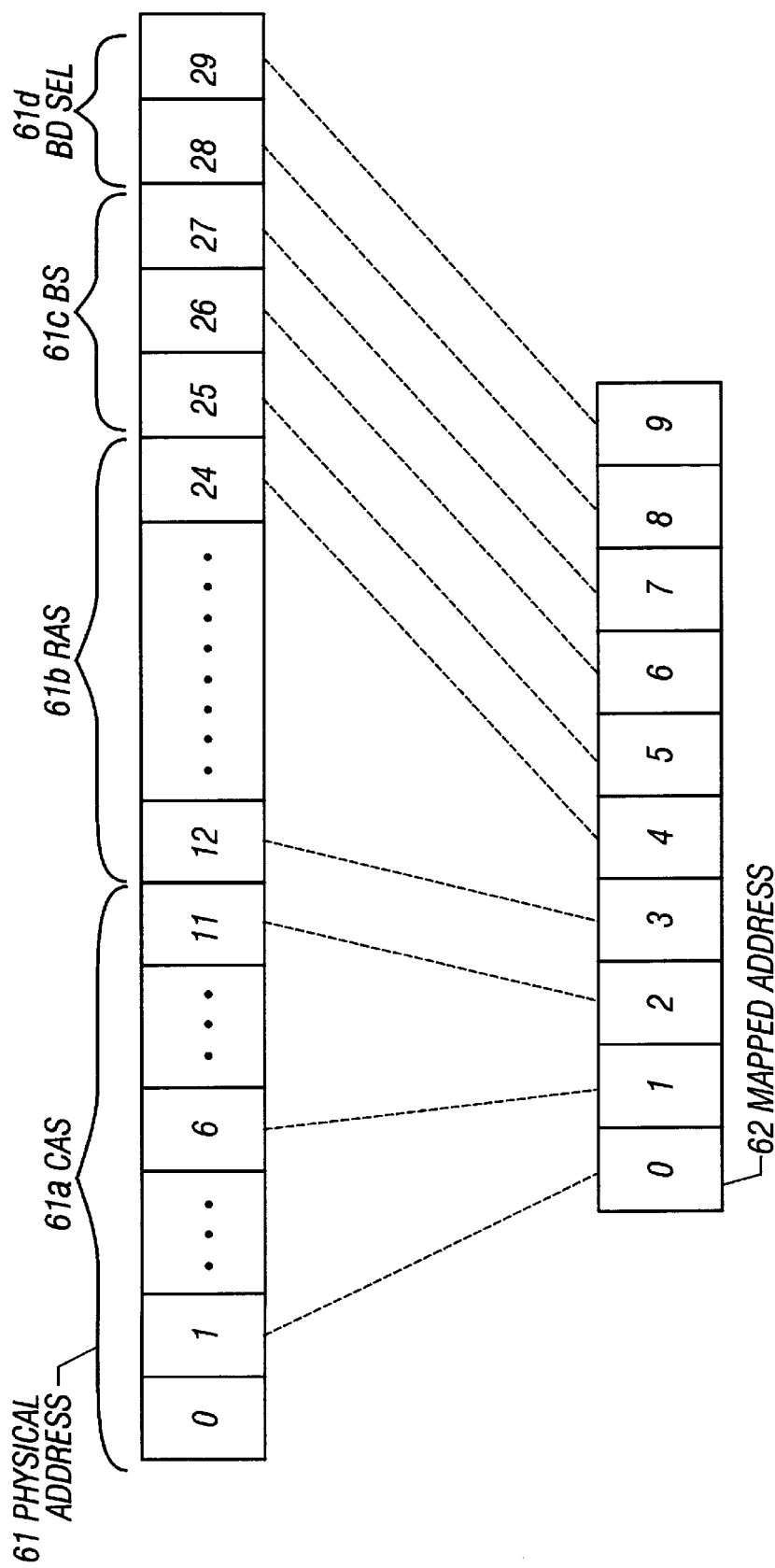
FIG. 6 is a pictorial representation of a translation of physical address space to mapped address space used to access the modelled memory of FIG. 2.

Referring now to FIG. 6, a physical address to mapped address translation is shown to include a physical address 61 which is typically made up of four fields, the Column Address Strobe (CAS) 61a, the Row Address Strobe (RAS) 61b, the Bank Select (BS) 61c and the Board Select (BdSel) 61d and a subset of these bits which make up the mapped address 62. If the simulated system uses a thirty bit bus to address memory, the physical address 61 may be further broken up into the four fields mentioned previously. The physical address 61 may have two bits of BdSel 61d, three bits of BS 61c, thirteen bits of RAS 61b and twelve bits of CAS 61a. Since a purpose of the simulation is to test the decoding of the addresses done outside of the memory device therefore, when selecting bits, all of the BdSel bits and BS bits are selected because it is the decoding of these bits that is tested. The memory decoding done within the device is dependent upon the RAS and CAS bits. Typically, this in-device decoding is checked by other techniques so fewer of the RAS and CAS bits are necessary when selecting bits to make up the mapped address 62 and thus the unselected bits can be ignored when developing the program to execute the simulation of the memory models. As such, the specific RAS and CAS bits selected are not critical to the success of the simulation. Accordingly, both of the BdSel bits, all three of the BS bits, two RAS bits and three CAS bits are selected to provide a ten bit mapped address 62 to access a particular memory model 15$c_i$.

Thus, use of a ten bit mapped address 62 results in only 1024 memory locations ($2^{10}$=1024) being needed to store data rather than the more than one billion memory locations necessary if the physical address 61 of thirty bits were used ($2^{30}$=1,073,741,824). This reduction in address size translates into a significant memory savings as well as permitting the simulation to run quicker because the memory is much smaller. This smaller memory also causes more collisions, thus exercising the collision handling functions more effectively.

Within the particular memory model 15$c_i$ accessed is a location containing a pointer 15$c_i$ to a corresponding block of memory 14$c_i$ within memory section 14c in which memory model 15$c_i$ will store data resulting from the transaction 52 executed by the CPU model 15a. To determine whether an error has occurred during the simulation in the actual data, each location in memory section 14c is compared to the predicted data in its corresponding location in memory section 14d. For example, location 14$c_a$ is compared to location 14$d_a$, location 14$c_b$ is compared to location 14$d_b$ and location 14$c_i$ is compared to location 14$d_i$.

Having described a preferred embodiment of the invention it will now become apparent to one of ordinary skill in the art that other embodiments incorporating its concepts may be provided. Accordingly, it is felt that the invention should not be limited to the disclosed embodiment but rather should be limited only by the spirit and scope of the appended claims.

What is claimed is:

1. A method for simulating memory in a computer system comprising the steps, performed by a simulator of:

allocating from a memory a first block of contiguous memory cells;

storing within said memory, a model of memory corresponding to a memory device;

assigning a corresponding one of said memory cells of said first block of contiguous memory cells to said model of memory;

storing a location of said corresponding one of said memory cells of said first block of contiguous memory cells within said model of memory;

generating a randomly selected computer transaction;

translating a physical bus address including four fields, a Column Address Strobe field, a Row Address Strobe field, a Bank Select field, and a Board Select field which identifies said memory device in said computer system to a mapped bus address which identifies said model of memory said step of translating including the step of:

selecting at least one bit, but less than all bits, from each of said Column Address Strobe field and said Row Address Strobe field and all of the bits from said Bank Select field and said Board Select field of said physical bus address to provide said mapped bus address;

predicting an effect of said randomly selected computer transaction on said first block of contiguous memory cells;

completing said randomly selected computer transaction and storing a result of said completed randomly selected computer transaction within said first block of contiguous memory cells; and comparing said predicted effect of said randomly selected computer transaction with the results of said completed randomly selected computer transaction.

\* \* \* \* \*